United States Patent
Spella

(10) Patent No.: US 9,608,334 B2
(45) Date of Patent: Mar. 28, 2017

(54) RADAR ANTENNA SYSTEM

(71) Applicant: NXP B.V., Eindhoven (NL)

(72) Inventor: Maristella Spella, Eindhoven (NL)

(73) Assignee: NXP B.V., Eindhoven (NL)

( * ) Notice: Subject to any disclaimer, the term of this patent is extended or adjusted under 35 U.S.C. 154(b) by 422 days.

(21) Appl. No.: 14/231,549

(22) Filed: Mar. 31, 2014

(65) Prior Publication Data

US 2015/0280327 A1  Oct. 1, 2015

(51) Int. Cl.

| | |
|---|---|
| *G01S 7/03* | (2006.01) |
| *G01S 13/93* | (2006.01) |
| *H01Q 19/10* | (2006.01) |
| *H01Q 19/06* | (2006.01) |
| *H01Q 1/22* | (2006.01) |
| *H01Q 23/00* | (2006.01) |
| *H01L 23/00* | (2006.01) |

(52) U.S. Cl.
CPC ............ *H01Q 19/10* (2013.01); *G01S 7/032* (2013.01); *H01L 24/18* (2013.01); *H01Q 1/2283* (2013.01); *H01Q 19/062* (2013.01); *H01Q 19/108* (2013.01); *H01Q 23/00* (2013.01); *G01S 7/036* (2013.01); *G01S 13/931* (2013.01); *G01S 2013/9314* (2013.01); *Y10T 29/49018* (2015.01)

(58) Field of Classification Search
CPC ....... G01S 7/032; G01S 13/931; H01Q 19/06; H01Q 19/062; H01Q 19/10; H01Q 19/108; H01Q 1/2283; H01Q 23/00
USPC ...................................... 342/5, 175
See application file for complete search history.

(56) References Cited

U.S. PATENT DOCUMENTS

| | | | | |
|---|---|---|---|---|
| 2007/0063056 A1* | 3/2007 | Gaucher | ............. | H01L 23/4334 235/492 |
| 2008/0291107 A1* | 11/2008 | Tsai | ......................... | H01Q 9/26 343/803 |
| 2009/0009007 A1* | 1/2009 | Kato | .................. | G06K 19/0701 307/104 |
| 2010/0193935 A1* | 8/2010 | Lachner | .............. | H01L 23/3135 257/693 |
| 2010/0283700 A1* | 11/2010 | Rajanish | .................. | H01L 23/66 343/793 |
| 2014/0110841 A1* | 4/2014 | Beer | ................. | H01L 23/49822 257/738 |
| 2014/0110858 A1* | 4/2014 | Beer | ....................... | H01L 24/19 257/774 |
| 2014/0184460 A1* | 7/2014 | Yen | ....................... | H01Q 13/106 343/770 |

(Continued)

FOREIGN PATENT DOCUMENTS

| | | |
|---|---|---|
| CN | 101320833 A | 12/2008 |
| DE | 102004059395 A1 | 6/2006 |

OTHER PUBLICATIONS

Tong et al.: Radiation Performance Enhancement of E-Band Antenna, IEEE Transactions on Components, Packaging and Manufacturing Technology, vol. 3, No. 11, Nov. 2013, pp. 1953-1959.*

(Continued)

*Primary Examiner* — Peter Bythrow
(74) *Attorney, Agent, or Firm* — Rajeev Madnawat

(57) ABSTRACT

A device is described. The device includes a chip, a reflector, and an antenna. The reflector is disposed on a surface of the chip. The reflector is a metalized layer on the surface of the chip.

9 Claims, 13 Drawing Sheets

(56) References Cited

U.S. PATENT DOCUMENTS

| | | | | |
|---|---|---|---|---|
| 2014/0198013 A1* | 7/2014 | Saraswat | ............... | H01L 21/486 343/893 |
| 2015/0177373 A1* | 6/2015 | Boeck | ....................... | G01S 7/02 342/52 |
| 2016/0178730 A1* | 6/2016 | Trotta | ..................... | G01S 7/032 342/175 |
| 2016/0190673 A1* | 6/2016 | Huang | ..................... | H01P 7/10 333/1 |

OTHER PUBLICATIONS

Extended European Search Report for Patent Appln. No. 15157662.6 (Aug. 17, 2015).

Ziqiang Tong, Alexander Fischer, Andreas Stelzer, and Linus Maurer, "Radiation Performance Enhancement of E-Band Antenna in Package", IEEE Transactions on components, packaging and manufacturing technology.

T. Meyer, G. Ofner, S. Bradl, M. Brunnbauer, R. Hagen, "Embedded Wafer Level Ball Grid Array (eWLB)", 10th Electronics Packaging Technology Conference, 2008.

meptec.org/Resources/Jun%208%20STATS%20ChipPAC.pdf.

Abouzar Hamidipour, Alexander Fischer, Linus Maurer, Walter Hartner, and Andreas Stelzer, "Antenna in package with stacked metallization", EUMW, Nuremberg, Germany, Oct. 7-10, 2013.

cache.freescale.com files analog doc fact sheet MR 200 FS.pdf.

D.R. Jackson and N.G. Alexopoulas, Simple approximate formulas for input resistance, bandwidth and efficiency of a resonant rectangular patch, IEEE Transactions on Antennas and Propagation, vol. 39, No. 3, pp. 407-410.; Mar. 1991.

Feger et al.: 77-GHz FMCW MIMO Radar based on SiGe single-chip TRx, IEEE transactions on microwave theory and techniques, vol. 57, No. 5, May 2009.

Y. P. Zhang and D. Liu, "Antenna-on-chip and antenna-in-package solutions to highly integrated millimeter-wave devices for wireless communications," IEEE Transactions on Antennas and Propagation, vol. 57, No. 10, pp. 2830-2841, Oct. 2009.

M. PourMousavi, M. Wojnowski, R. Agethen, R.Weigel, A. Hagelauer, "The Impact of Embedded Wafer Level BGA Package on the Antenna performance", Antennas and Propagation in Wireless Communications (APWC), 2013 IEEE-APS, Sep. 2013.

\* cited by examiner

RADAR ANTENNA SYSTEM

The demand for low-cost, high performance, compact radar systems for millimeter wave (mm-wave) applications has risen in the past few years. As a result, the development of integrated antenna-in package (AIP) systems has become more important. At mm-wave frequencies, the RF-performance of the system is no longer determined only by the transceiver circuits and the antenna, but also strongly depends on the package and the interconnection between the transceiver and the antenna. Conventional antenna-on-chip (AoC) solutions generally suffer from low antenna efficiency and low bandwidth due to the large influence of surrounding components.

Embodiments of a device are described. In one embodiment, the device includes a chip, a reflector, and an antenna. The reflector is disposed on a surface of the chip. The reflector is a metalized layer on the surface of the chip. Other embodiments of the device are also described.

Embodiments of a method are also described. In one embodiment, the method is a method for forming an antenna package. The method includes forming a chip. The method also includes metalizing a surface of the chip to form a reflector. The method also includes disposing an antenna in electronic communication with the chip. The antenna is at least partially aligned with the reflector at a distance from the surface of the chip. Other embodiments of the method are also described.

Embodiments of an apparatus are also described. In one embodiment, the apparatus includes a frontside redistribution layer, a backside redistribution layer, a mold, a chip, a reflector, and an antenna. The mold is disposed between the frontside redistribution layer and the backside redistribution layer. The chip is disposed on the frontside redistribution layer. The chip is disposed at least partially within the mold. The reflector is a metalized layer on a backside of the chip. The backside of the chip is opposite the frontside redistribution layer. The antenna is disposed on the backside redistribution layer. The antenna is electrically connected with the chip through the frontside redistribution layer. The antenna is at least partially aligned with the reflector at a distance from the backside of the chip. Other embodiments of the apparatus are also described.

Other aspects and advantages of embodiments of the present invention will become apparent from the following detailed description, taken in conjunction with the accompanying drawings, illustrated by way of example of the principles of the invention.

FIG. 4 depicts a perspective view of one embodiment of the system of FIG. 3a.

Throughout the description, similar reference numbers may be used to identify similar elements.

Figure 1:
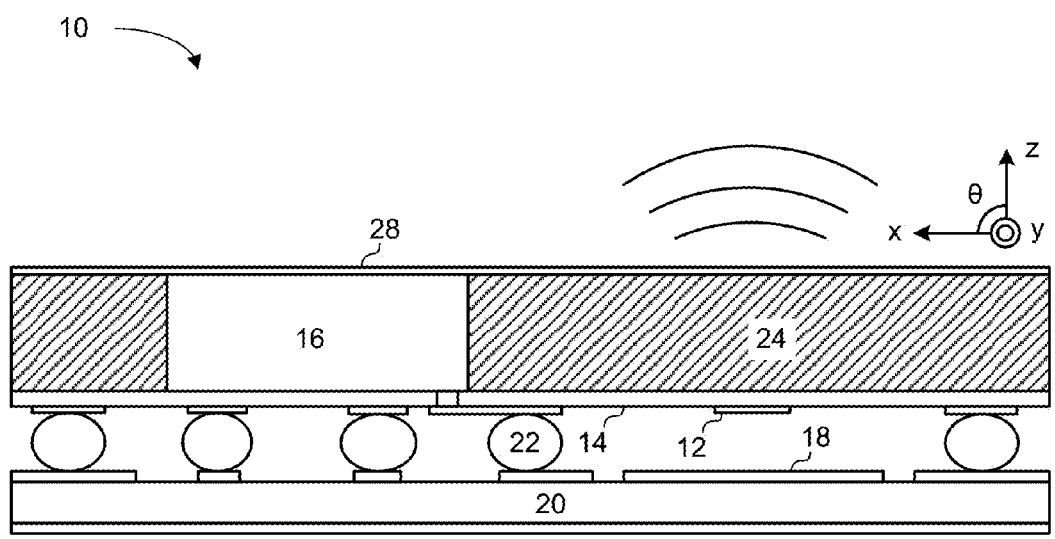
FIG. 1 depicts a cross-sectional schematic diagram of a conventional device.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments provide a cost-effective antenna package with reduced size and cost as well as reduced sensitivity to solder balls, interconnectivity, soldering process, mold thickness, and overall package size.

Embodiments described herein also may achieve improved radiation pattern and total gain, as well as reduced surface wave losses.

These and other embodiments may be used to combine integrated circuits and antenna arrays. For example, embodiments discussed below may be incorporated into embedded wafer level ball grid arrays (eWLB). This may be beneficial for use in automotive applications such as parking aids or lateral collision avoidance systems. Other embodiments may be beneficial in other radar systems or mm-wave systems. For example, mm-wave communication in the 60 GHz range may be used to transfer data-intensive files or streams such as high-definition video or ultra high bit-rate data streams. Systems operating over 100 GHz may be used to provide imaging for scanners, sensors, monitors, or surveillance systems. Other embodiments may be incorporated into other applications at various fixed or variable operating frequencies. A reduced package size and cost with improved performance provides for new opportunities in a wide variety of applications.

FIG. 1 depicts a cross-sectional schematic diagram of a conventional device 10. The device 10 includes an antenna 12, a redistribution layer (RDL) 14, a chip 16, a reflector 18, a printed circuit board (PCB) 20, solder balls 22, a mold 24, and a protection layer 28. In the illustrated diagram, the antenna 12 is disposed on the RDL 14. The RDL 14 allows the antenna 12 to electrically connect to the chip 16. The reflector 18 is formed on the PCB 20. The reflector 18 is also aligned with the antenna 12. The reflector 18 reflects signals to and from the antenna 12 to increase the radiation strength in a target direction. In some cases, the target direction is θ=0° or perpendicular to the surface of the antenna 12 and reflector 18. A protection layer 28 is applied to the chip 16 and the mold 24. The protection layer 28 is used as a director for the antenna 12 to affect the radiation from the antenna 12. The PCB 20 and the RDL 14 are electrically connected by the solder balls 22.

The alignment of the antenna 12 and the reflector 18 depends heavily on the solder balls 22. If the solder balls 22 are not uniform in size and alignment, the antenna 12 and the reflector 18 will be misaligned, which degrades performance by affecting matching and insertion loss of the antenna 12. Additionally, the solder balls 22 and their connections as well as the surface of the PCB 20 create unwanted and unavoidable reflections. This further degrades the performance of the device 10. Moreover, the placement of the antenna 12 and the reflector 18 next to the chip 16 requires a total device size large enough to accommodate the arrangement and avoid coupling of the components.

Figure 2:
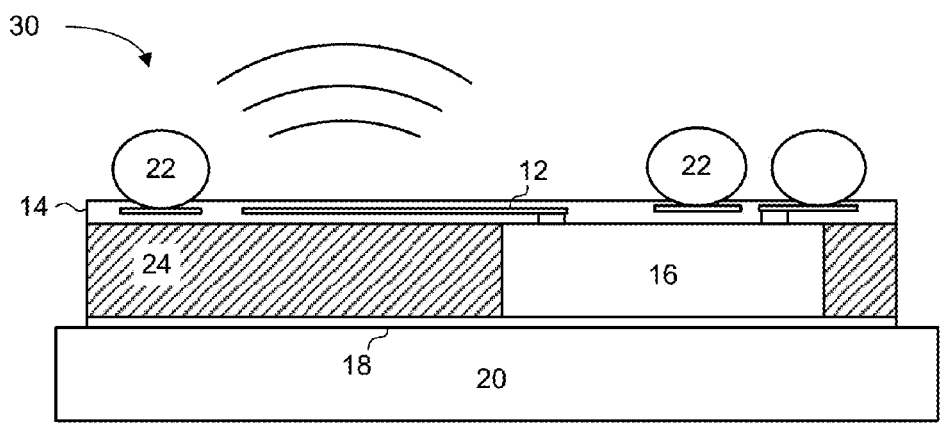
FIG. 2 depicts a cross-sectional schematic diagram of another conventional device.

FIG. 2 depicts a cross-sectional schematic diagram of another conventional device 30. The depicted device 30 includes an antenna 12, a RDL 14, a chip 16, a reflector 18, a PCB 20, and solder balls 22. The antenna 12 is formed on the RDL 14 and electrically connected to the chip 16. The reflector 18 is formed on the PCB 20. The reflector 18 is separated from the antenna 12 by the mold 24. The solder balls 22 are connected to the RDL 14.

The relatively large amount of mold 24 separating the reflector 18 and the antenna 12 causes considerable surface wave loss at higher frequencies. This may adversely impact the radiation pattern and antenna gain in the target direction. Additionally, embodiments of the device 30 also suffer from an overly large device area due to the need to provide space for the antenna 12 and reflector 18 to interact. The thickness of the mold 24 of the devices 10 and 30 overall acts as a dielectric resonator making the antenna 12 extremely sensitive to the size of the devices 10 and 30. The overall area required by the devices 10 and 30 also increases cost and space requirements in the recipient system.

Figure 3A:
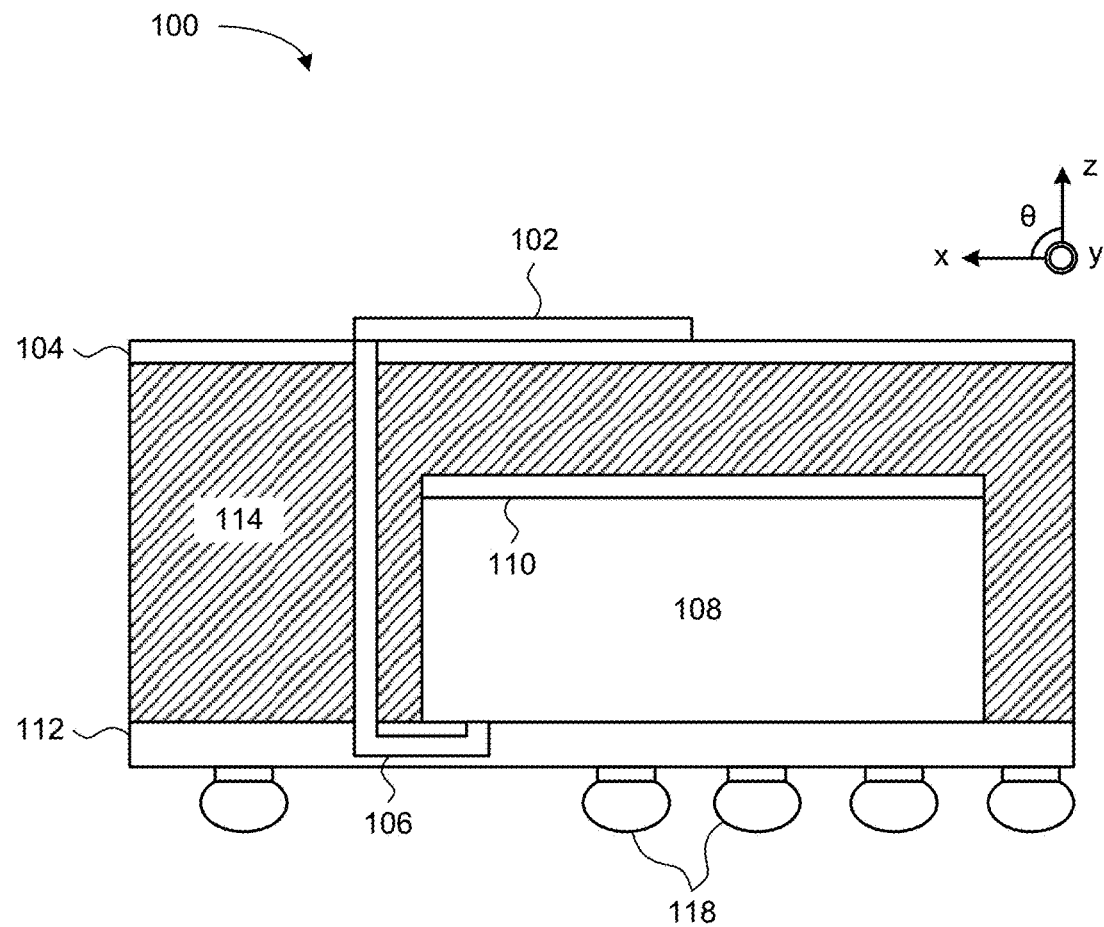
FIG. 3a depicts a cross-sectional schematic diagram of one embodiment of an antenna system.

FIG. 3a depicts a cross-sectional schematic diagram of one embodiment of an antenna system 100. The illustrated embodiment of the antenna system 100 includes an antenna 102, a backside redistribution layer (backside RDL) 104, a via 106, a chip 108, a reflector 110, a frontside redistribution layer (frontside RDL) 112, a mold 114, and solder balls 118.

In the illustrated embodiment, the antenna 102 is placed on the backside RDL 104. In some embodiments, the antenna 102 is a dipole and receives a differential signal from the chip 108 or some outside source (not shown). In some embodiments, the system 100 operates between 76 GHZ and 81 GHz. In other embodiments, the system 100 may operate above 120 GHz. Other embodiments of the system 100 may operate at different frequencies. The antenna 102 is connected to the chip 108 by the via 106 which connects through the backside RDL 104, passes through the mold 114, and connects to the frontside RDL 112 which connects to the chip 108.

The reflector 110 is disposed on the backside of the chip 108. In some embodiments, the reflector 110 is a metalized layer applied to the surface of the chip 108 during manufacture of the system 100. In other embodiments, the reflector 110 is a metalized portion of the chip 108 that is applied during manufacture of the chip 108 itself.

As the antenna 102 transmits or receives a signal, the reflector 110 directs the signal in the target direction. For example, if the antenna 102 is transmitting, the reflector 110 receives the transmitted signal from the antenna 102 and reflects the signal in the target direction increasing signal strength and forming a radiation pattern aligned with the target direction. In some embodiments, the antenna 102 is a transmitter. In other embodiments, the antenna 102 is a receiver. In another embodiment, the antenna 102 operates as both a transmitter and a receiver.

The antenna 102 is aligned and interacts with the reflector 110. If the antenna 102 is receiving a signal, the reflector 110 directs at least a portion of the signal that has not reached the antenna 102 to impinge on the antenna 102 as the target thereby increasing the reception capacity and quality of the antenna 102 and the system 100 as a whole. In some embodiments, the antenna 102 is configured to operate between 76 GHz and 81 GHz with a certain area. The area of the antenna 102 may be reduced if operating above 81 GHz due to the smaller free space wavelength of the signal.

In some embodiments, the orientations, sizes, and placements of the antenna 102 and the reflector 110 provide for other advantages. For example, with the reflector 110 disposed on the backside of the chip 108, and the antenna 102 on the backside RDL 104 and aligned with the reflector 110, the amount of mold 114 between the antenna 102 and the reflector 110 is significantly less than in some conventional systems (see FIG. 2). With a reduced mold thickness between the antenna 102 and the reflector 110, surface wave losses and sensitivity to package size are significantly reduced.

Additionally, the distance between the antenna 102 and the reflector 110 can be more easily controlled in manufacturing and use than is possible if the distance is controlled by solder ball height (see FIG. 1). Additionally, the alignment of the antenna 102 with respect to the reflector 110 is fixed by the mold 114 granting higher durability and consistency in performance over time and in various conditions (heat, particulates, vibration, impact, pressure, etc.).

In the illustrated embodiment, the chip 108 is disposed on the frontside RDL 112. In some embodiments, the chip 108 is a monolithic microwave integrated circuit (MMIC). In some embodiments, the chip 108 is a transceiver capable of operating one or more antennas 102. In other embodiments, the chip 108 may be a simple controller, signal generator, or other signal or power managing component. The connection between the chip 108 and the frontside RDL 112 allows for electrical communication between chip 108 and the connections of the frontside RDL 112.

The frontside RDL 112 provides for connections for routing and control of electrical power and signals. For example, the frontside RDL 112 provides electrical communication between the chip 108 and the via 106. The frontside RDL 112 may also provide for structural support of the various components of the system 100. The frontside RDL 112 also provides connection and mounting for the solder balls 118.

The solder balls 118 provide contacts for connection with another electrical component. For example, the solder balls 118 may provide electrical contact points for connection with a PCB or for connection with another electrical system. In some embodiments, the solder balls 118 provide electrical connections for more than one external or internal component.

In contrast, in the conventional systems shown in FIGS. 1 and 2, the solder balls 22 must be uniform to avoid misalignment and impact on the efficiency of the devices 10 and 30. This can create difficulties and expense in manufacturing and result in inconsistency from one device to the next. In the illustrated embodiment shown in FIG. 3a, the size of the solder balls 118 may vary without significant impact on the effectiveness or consistency of performance of the system 100. This reduces cost in manufacturing and improves consistency from one system to the next.

In some embodiments, the components discussed above are fixed to one another. In other embodiments, one or more of the components is modular to allow for customization and interchangeability of components. Other embodiments may include fewer or more components and less or more functionality.

Figure 3B:
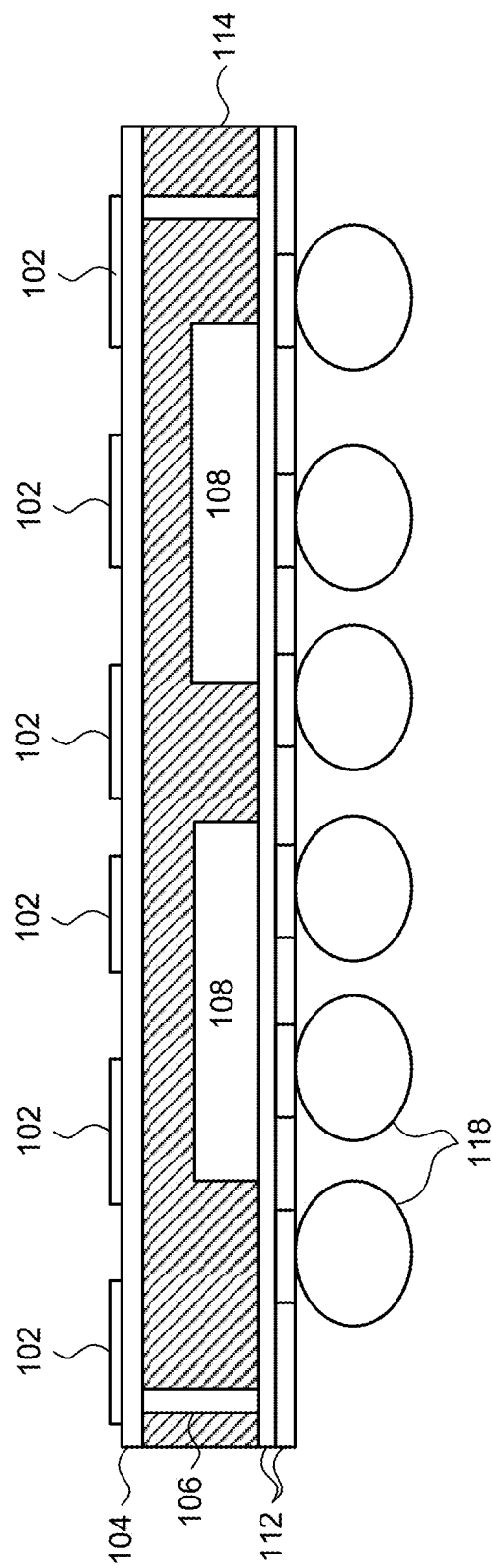
FIG. 3b depicts a cross-sectional schematic diagram of one embodiment of a double side antenna system.

FIG. 3b depicts a cross-sectional schematic diagram of one embodiment of a double side antenna system. As described above, the reduced package size of the instant invention allows for more dense arrangements. The illustrated embodiment depicts multiple chips 108 connected to multiple antennas 102. In addition, multiple RDLs 104 and 112 may be incorporated to facilitate more complex connections and further reduce package size. Other embodiments with multiple antennas 102 are described in more detail below with reference to other figures.

Figure 4:
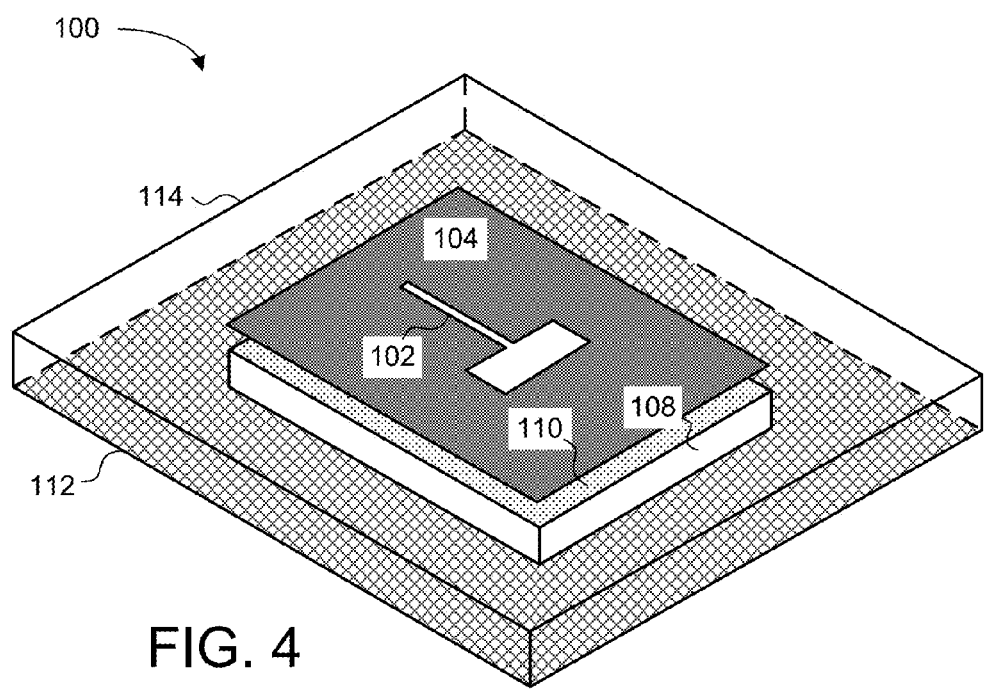

FIG. 4 depicts a perspective view of one embodiment of the system 100 of FIG. 3a. The illustrated embodiment of the system 100 shows an embodiment of the general spatial relationship of the components described above with reference to FIG. 3a. In particular, the illustrated embodiment shows the mold 114 disposed on the frontside RDL 112. In some embodiments, the mold 114 matches the area of the frontside RDL 112. In the illustrated embodiment, the mold 114 substantially encloses the chip 108. The reflector 110 is disposed on the backside of the chip 108 below the upper surface of the mold 114. The antenna 102 is disposed on the backside RDL 104. In the illustrated embodiment, the backside RDL 104 has the same area as the chip 108 and the reflector 110. In other embodiments, the backside RDL 104 has the same area as the frontside RDL 112 (see FIG. 3a). In some embodiments, the backside RDL 104 has a unique geometry.

The illustrated embodiment shows another perspective on the distance between the reflector 110 and the antenna 102. The relative orientations of the various components shown may be calibrated for a specific application or purpose. For example, the mold 114 may have a thickness of 670 μm with the chip 108 having a thickness of 470 μm. This would yield a separation of 200 μm between the antenna 102 and the reflector 110. Other embodiments may have a separation between 180-220 μm. Other embodiments implement components having different thicknesses. For example, the thickness of the mold 114 may be from 670 μm (mentioned above) up to 765 μm while the thickness of the chip 108 may range from 100 μm to 700 μm. Other thicknesses, orientations, separations, and sizes may also be implemented.

Figure 5:
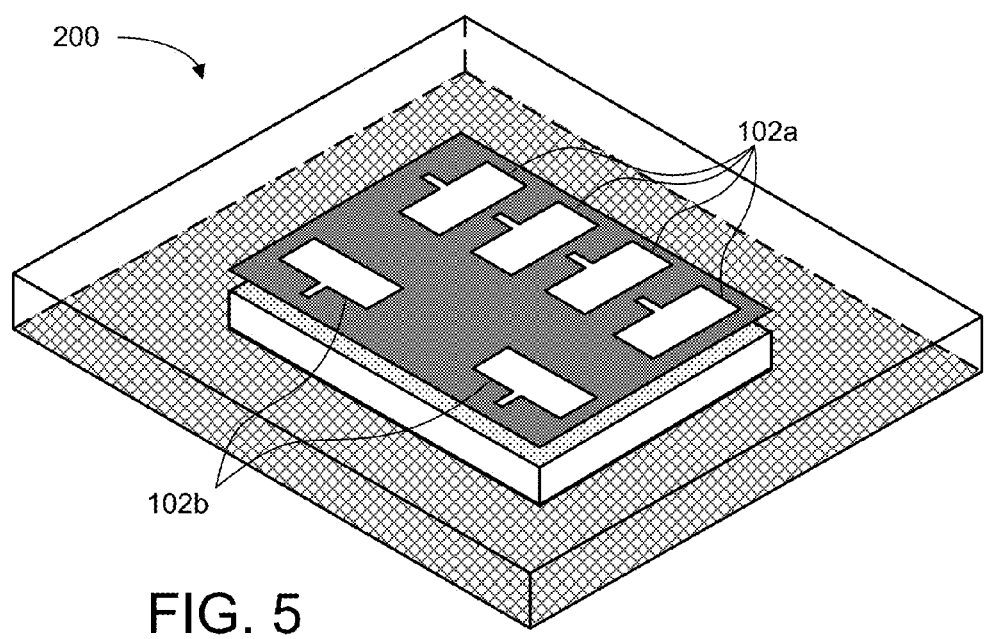
FIG. 5 depicts a perspective view of one embodiment of a multiple antenna system.

FIG. 5 depicts a perspective view of one embodiment of a multiple antenna system 200. The illustrated embodiment is similar in some ways to the system 100 of FIG. 4. In the illustrated embodiment, multiple antennas 102a and 102b are applied to the backside RDL 104. In some embodiments, the antennas 102a and 102b are configured to receive or transmit signals. In one embodiment, the antennas 102a and 102b are configured to both transmit and receive signals. In another embodiment, the antennas 102 are dedicated antennas. For example, in one embodiment antennas 102a are receiver antennas and antennas 102b are transmitter antennas. The illustrated embodiment includes four receiver antennas (Rx) 102a and 2 transmitter antennas (Tx) 102b. Other embodiments may include fewer or more receiver antennas 102a and fewer or more transmitter antennas 102b. In some embodiments, the antennas 102a and 102b may operate to detect at a plurality of ranges and detect a plurality of positional characteristics such as distance, speed, and angular resolution. Other embodiments may include other antenna arrangements, quantities, and/or ratios.

Figure 6:
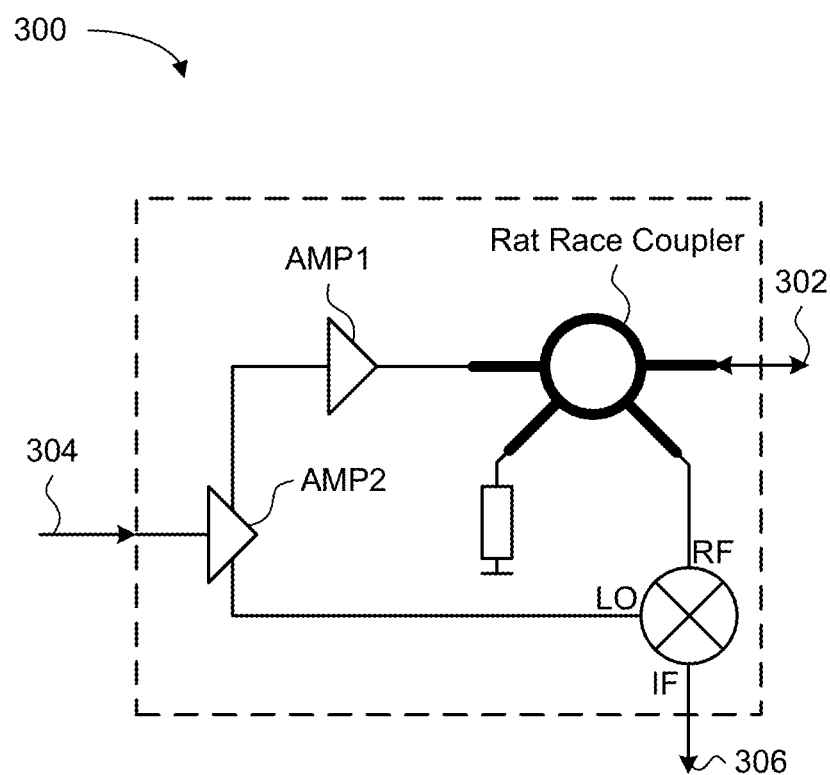
FIG. 6 depicts a schematic diagram of one embodiment of a transmitter-receiver cell.

FIG. 6 depicts a schematic diagram of one embodiment of a transmitter-receiver cell 300. In the illustrated embodiment, the transmitter-receiver cell 300 is coupled to the antenna 102 via the antenna contact 302. The transmitter-receiver cell 300 also includes an input 304 fed to the amplifier end. The input 304 receives and RF input. The transmitter-receiver cell 300 also includes an output 306. The output 306 outputs to the baseband hardware. The transmitter-receiver cell 300 facilitates use of an antenna 102 as both a transmitter and a receiver. Additionally, the illustrated transmitter-receiver cell 300 may be reconfigurable to accommodate a multiple antenna arrangement as shown in FIG. 5 and the accompanying description.

Figure 7:
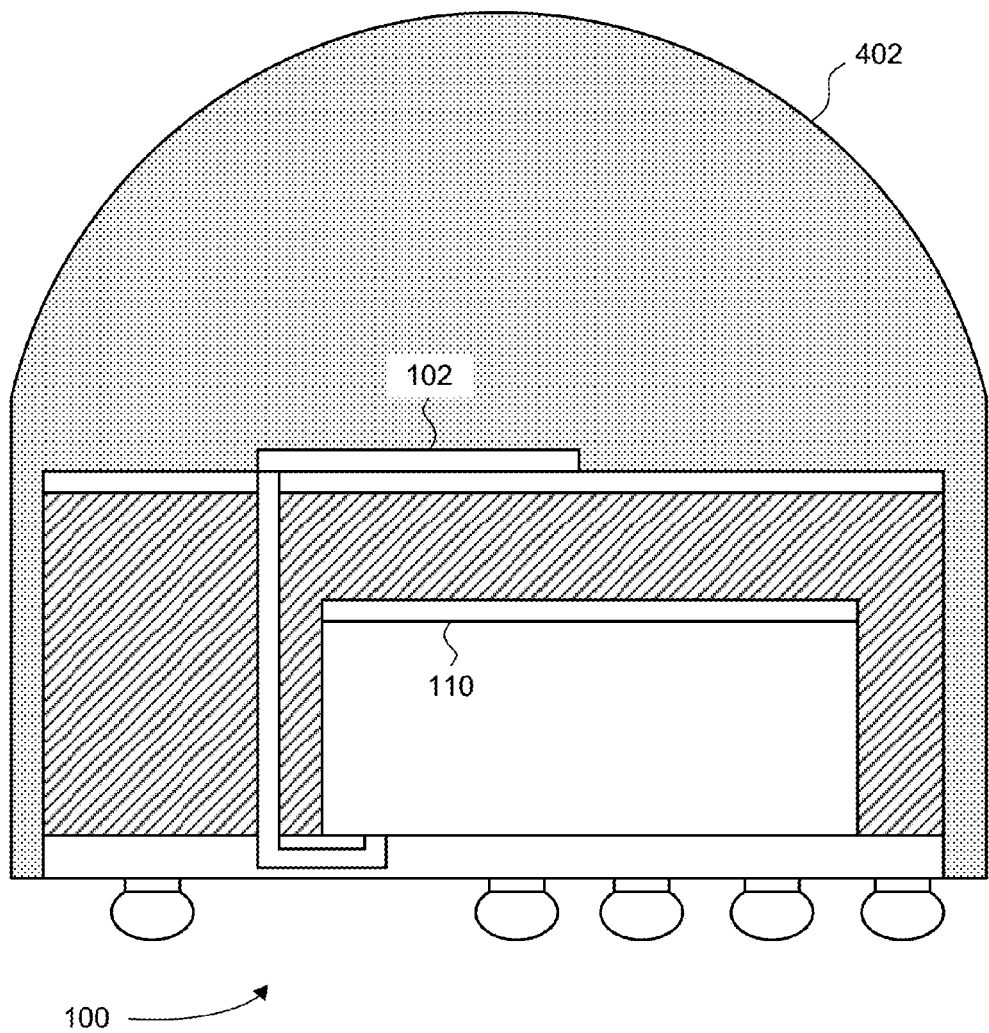
FIG. 7 depicts a cross-sectional schematic diagram of one embodiment of the antenna system of FIG. 3a with a rod lens.

FIG. 7 depicts a cross-sectional schematic diagram of one embodiment of the antenna system 100 of FIG. 3 with a rod lens 402. The illustrated embodiment includes an antenna system 100, as described with respect to FIG. 3a, with a rod lens 402 applied. The rod lens 402 is a dielectric material applied to the system 100. The rod lens 402 enhances the performance of the system 100 by affecting the radiation to and from the system 100. In some embodiments, the rod lens 402 is aligned with the antenna 102. In another embodiment, the rod lens 402 is aligned with the antenna 102 and/or the reflector 110.

The dimensions of the rod lens 402 affect the amount of gain afforded to the antenna 102. In some embodiments, the rod lens 402 can enhance antenna gain by up to 16 dBi. For some applications, a domed rod lens 402 is desirable. In other embodiments, other geometries may provide specific advantages in one or more specific or general applications.

Figure 8:
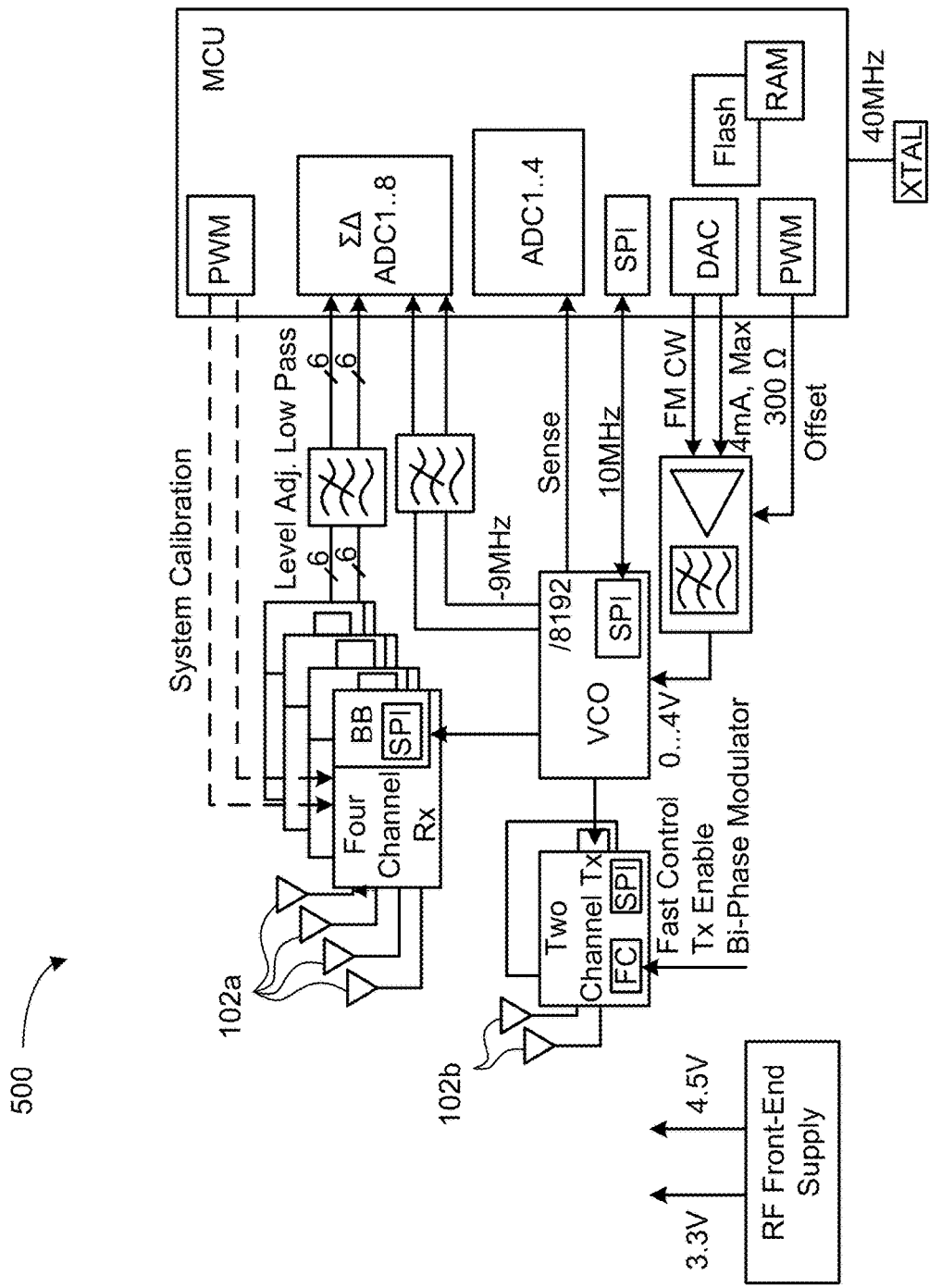
FIG. 8 depicts a circuit diagram of one embodiment of a chipset architecture.

FIG. 8 depicts a circuit diagram of one embodiment of a chipset architecture 500. The illustrated embodiment corresponds to the system 200 of FIG. 5. Specifically, the architecture 500 facilitates operation of a four channel receiver array corresponding to antennas 102a (also shown and described in FIG. 5) and a two channel transmitter array corresponding to antennas 102b. The illustrated architecture 500 facilitates detection of range, velocity, and angular resolution of a target relative to the antennas 102a and 102b. Other embodiments include fewer or more components to implement less or more functionality.

Figure 9:
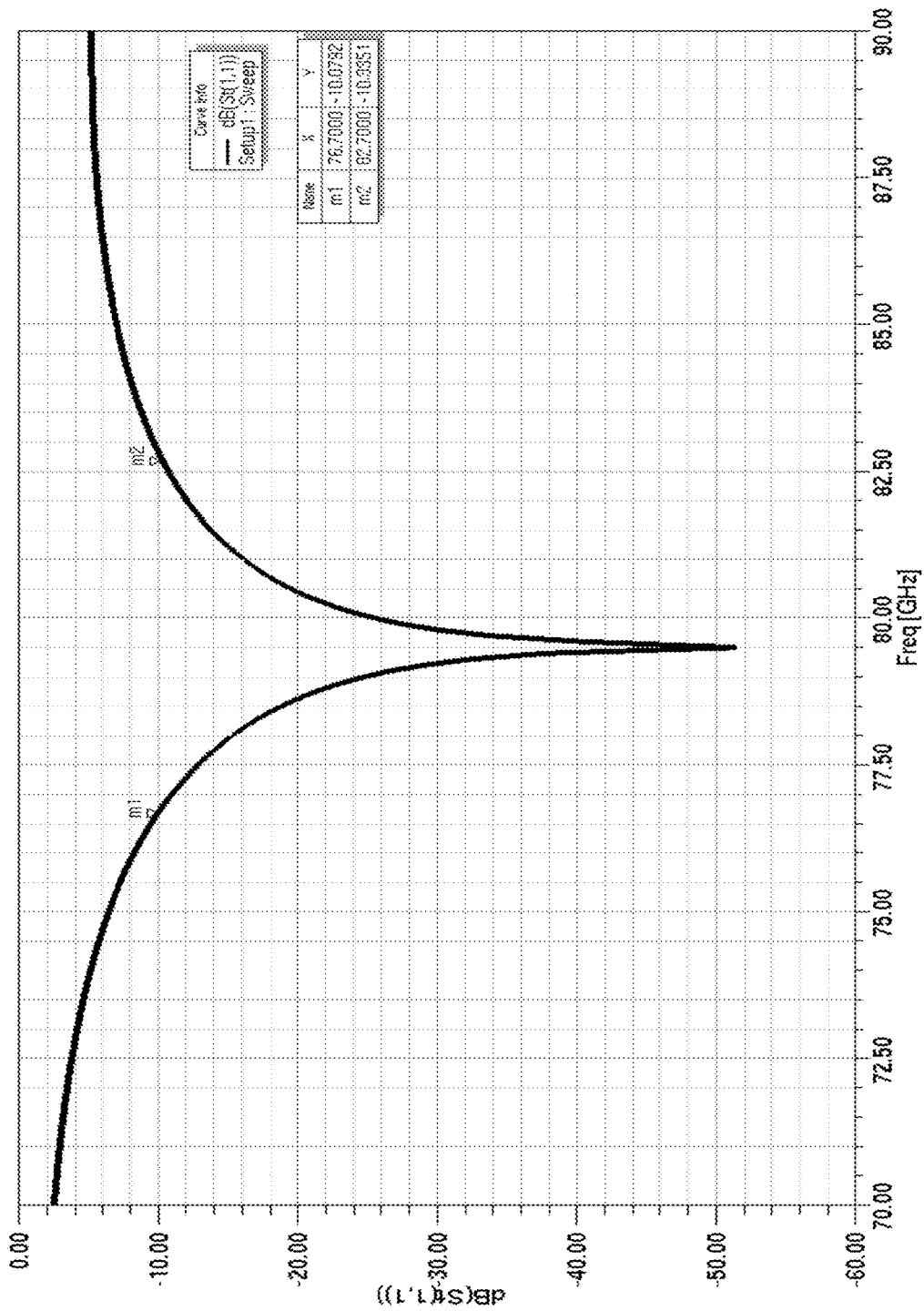
FIG. 9 depicts a graph of impedance bandwidth of one embodiment of an antenna system.

FIG. 9 depicts a graph of impedance bandwidth of one embodiment of an antenna system 100. The source impedance is 100 Ohms for the data set. From the data of the graph, the return loss for a frequency range of 77.6 GHz to 82.7 GHz is better than 10 dB.

Figure 10:
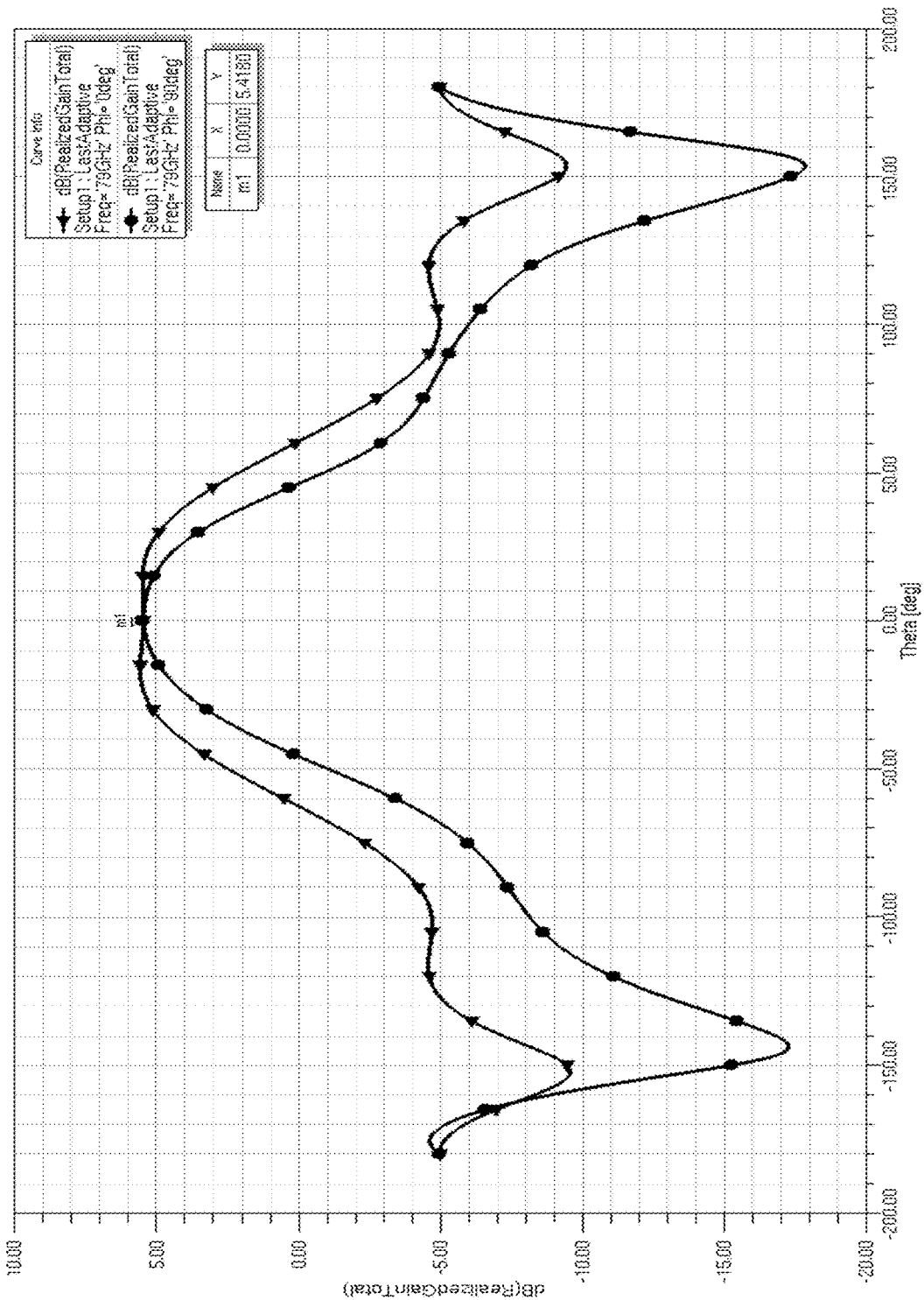
FIG. 10 depicts a graph of gain relative to theta for one embodiment of an antenna system.

FIG. 10 depicts a graph of gain relative to theta of an antenna system. This data corresponds to a theta equal to 0° (triangular markers) and theta equal to 90° (circular markers). The realized gain for theta equal to 0° is 5.4 dBi at 79 GHz.

Figure 11:
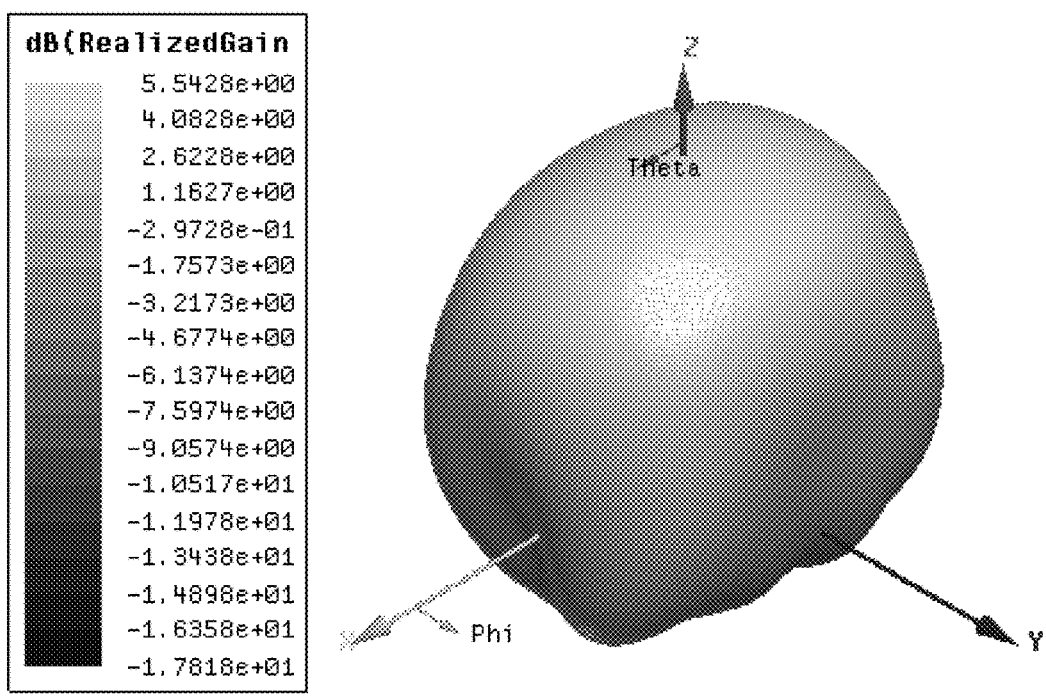
FIG. 11 depicts a three-dimensional graph of the data described in FIG. 10 for all ranges.

FIG. 11 depicts a three-dimensional graph of the data described in FIG. 10 for all ranges. The maximum realized gain for all ranges is 5.5 dBi.

Figure 12:
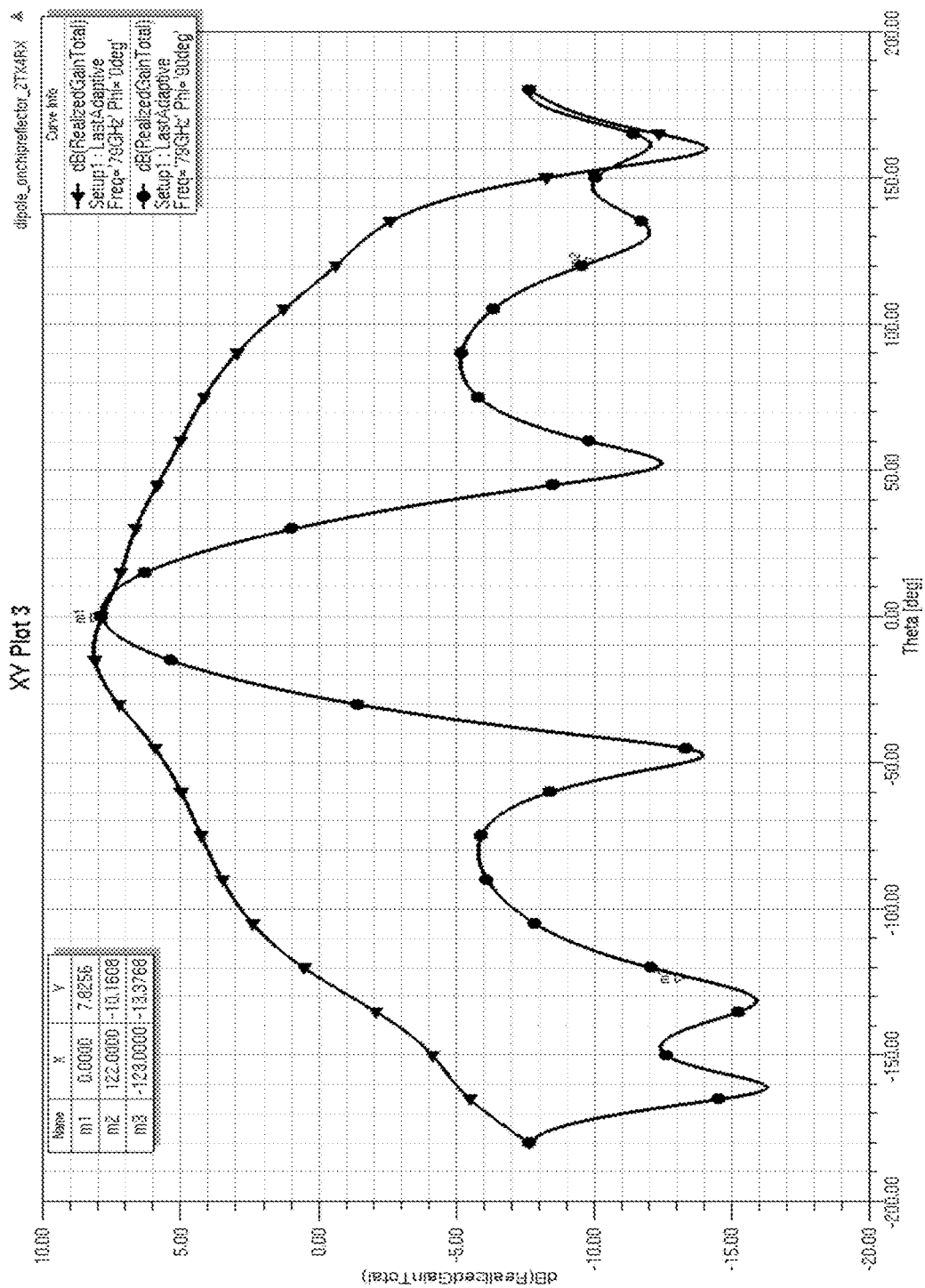
FIG. 12 depicts a graph of gain relative to theta for one embodiment of a four-receiver antenna system.

FIG. 12 depicts a graph of gain relative to theta for one embodiment of a four-receiver antenna system. This data was generated for the planes of phi equal to 0° and 90°. The realized gain for theta equal to 0° is 7.8 dBi at 79 GHz.

Figure 13:
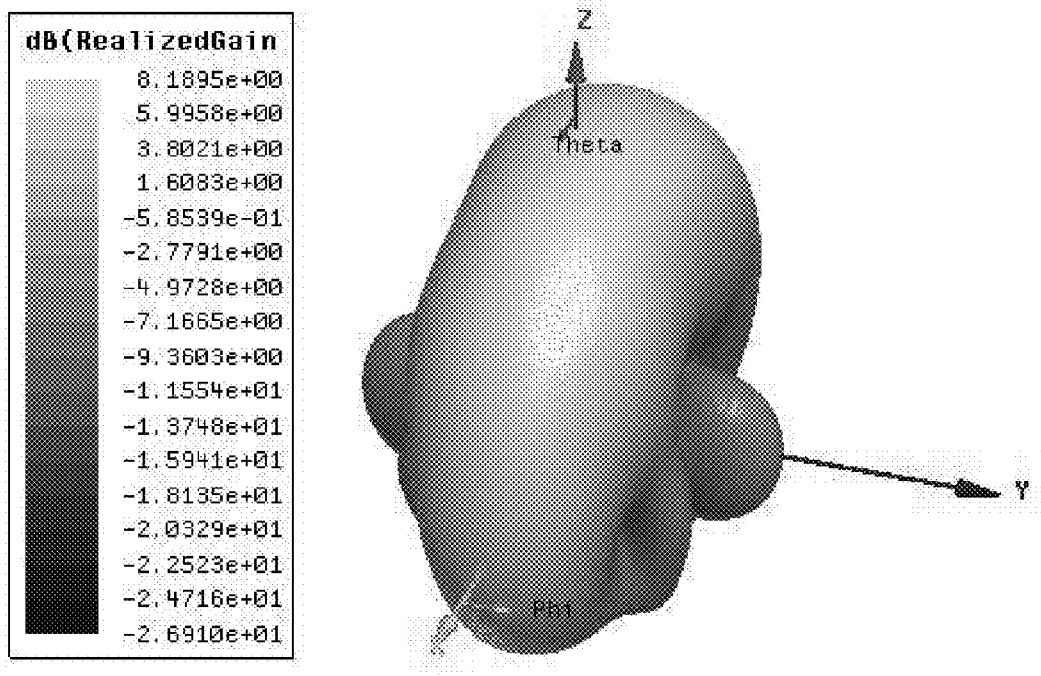
FIG. 13 depicts a three-dimensional graph of the data described in FIG. 12 for all ranges.

FIG. 13 depicts a three-dimensional graph of the data described in FIG. 12 for all ranges. The maximum realized gain for all ranges is 8.2 dBi. This data shows that a multiple antenna system may be implemented with the antenna-reflector configuration described above. While certain gain amounts may be realized by certain physical configurations and/or operating conditions, other gain amounts may be achieved by systems with different physical configurations and/or operating conditions.

Figure 14:
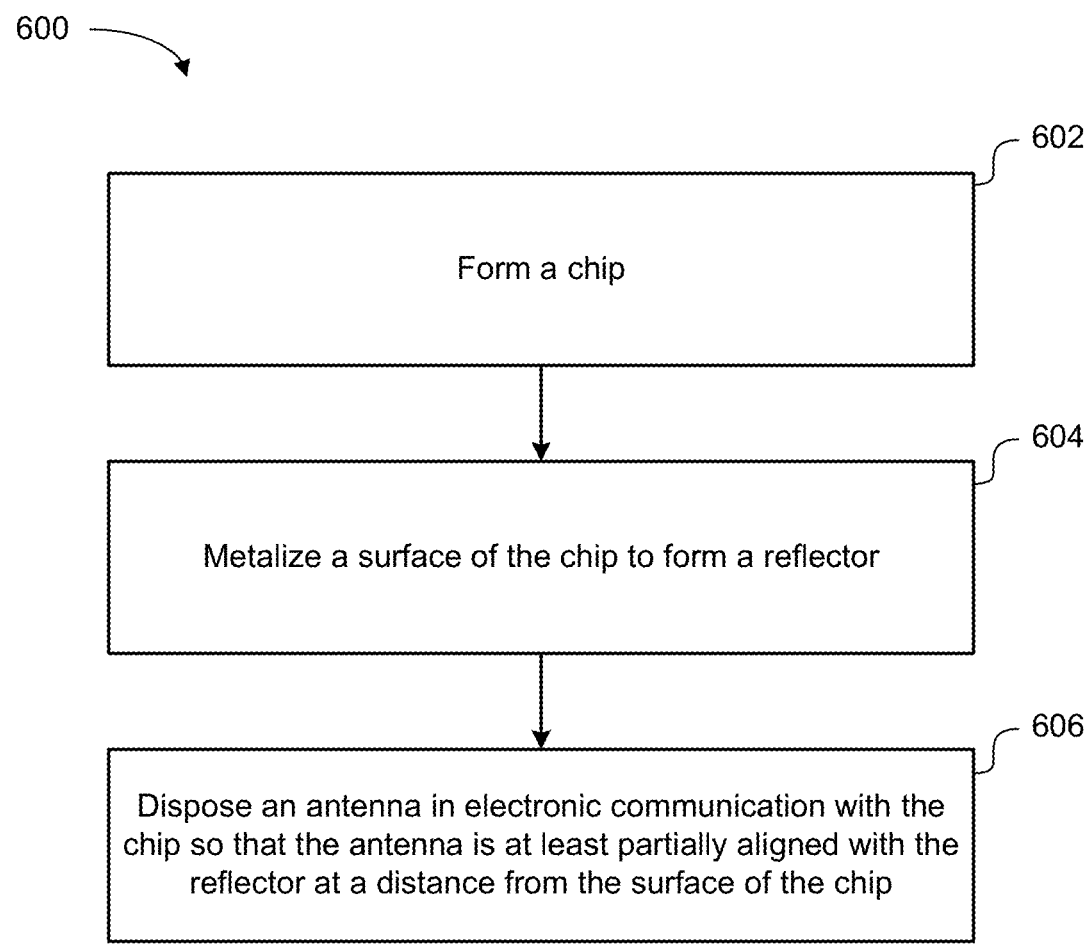
FIG. 14 depicts a flowchart diagram of one embodiment of a method of forming an antenna package.

FIG. 14 depicts a flowchart diagram of one embodiment of a method 600 of forming an antenna package. Although the method 600 is described in conjunction with the system 100 of FIG. 3a, embodiments of the method 600 may be implemented with other types of antenna systems.

At block 602, a chip 108 is formed. At 604, a surface of the chip 108 is metalized to form a reflector 110. In some embodiments, the reflector 110 may be formed during the manufacture of the chip 108. In another embodiment, the reflector 110 may be formed after the chip 108 has been manufactured.

At block 606, an antenna 102 is disposed in electronic communication with the chip 108. The antenna 102 is at least partially aligned with the reflector 110 at a distance from the surface of the chip 108. The depicted method 600 then ends.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

An embodiment of the system includes at least one component coupled directly or indirectly to memory elements through a system bus such as a data, address, and/or control bus. The memory elements can include local memory employed during actual execution of the program code, bulk storage, and cache memories which provide temporary storage of at least some program code in order to reduce the number of times code must be retrieved from bulk storage during execution.

What is claimed is:

1. A system comprising:
a frontside redistribution layer;
a backside redistribution layer;
a mold disposed between the frontside redistribution layer and the backside redistribution layer;
a chip having a frontside, a backside, and sidewalls, the frontside of the chip disposed on the frontside redistribution layer;
a reflector, which is a metalized layer, on the backside of the chip, wherein the backside of the chip is opposite the frontside redistribution layer;
wherein the mold encapsulates the backside of the chip and the reflector and the mold encapsulates the sidewalls of the chip; and
an antenna disposed on the backside redistribution layer, wherein the antenna is electrically connected with the chip through the frontside redistribution layer, wherein the antenna is at least partially aligned with the reflector at a distance from the backside of the chip;
wherein the chip and the reflector are oriented with respect to the antenna such that the antenna is disposed nearer to the backside of the chip than to the frontside of the chip; and
wherein the reflector and the antenna are separated by a portion of the mold that is between the reflector and the backside redistribution layer, and wherein the distance between the antenna and the reflector is fixed by the portion of the mold.

2. The system of claim 1, wherein the distance between the antenna and the reflector is approximately 200 μm.

3. The system of claim 1, further comprising a single transceiver and a plurality of antennas.

4. The system of claim 3, wherein the plurality of antennas is configured to operate at a plurality of ranges.

5. The system of claim 3, wherein the plurality of antennas is configured to perform a plurality of detection types comprising at least two of a list of detection types, the list of detection types comprising range detection, velocity detection, and angular resolution.

6. The system of claim 1, wherein the antenna is a dipole fed by a differential signal.

7. The system of claim 1, wherein the system operates on a frequency band from 76 GHz to 81 GHz.

8. The system of claim 1, wherein the system operates on a frequency above 120 GHz.

9. The system of claim 1, further comprising a dielectric rod lens to increase gain of the antenna.

* * * * *